(12) United States Patent
Banerjee

(10) Patent No.: US 7,467,344 B2
(45) Date of Patent: Dec. 16, 2008

(54) DEVICES AND SYSTEM FOR EXCHANGE OF DIGITAL HIGH-FIDELITY AUDIO AND VOICE THROUGH A WIRELESS LINK

(75) Inventor: Debarag Narayan Banerjee, Sunnyvale, CA (US)

(73) Assignee: Avnera Corporation, Beaverton, OR (US)

( * ) Notice: Subject to any disclaimer, the term of this patent is extended or adjusted under 35 U.S.C. 154(b) by 542 days.

(21) Appl. No.: 11/317,705

(22) Filed: Dec. 23, 2005

(65) Prior Publication Data

US 2007/0162834 A1 Jul. 12, 2007

(51) Int. Cl.
*H03M 13/00* (2006.01)
(52) U.S. Cl. .................................................. 714/755
(58) Field of Classification Search ............... 714/755, 714/786, 784, 782
See application file for complete search history.

(56) References Cited

U.S. PATENT DOCUMENTS 7,024,616 B2 * 4/2006 Ohira et al. ............... 714/786
7,032,154 B2 * 4/2006 Kidorf et al. .............. 714/755
7,146,553 B2 * 12/2006 Jarchi et al. ............... 714/755
7,289,530 B1 * 10/2007 Yaun et al. ................. 370/465

* cited by examiner

Primary Examiner—Shelly A Chase
(74) Attorney, Agent, or Firm—Joseph P. Curtin

(57) ABSTRACT

Systems and methods for communicating source data between a source device and a listener device are disclosed. In an exemplary embodiment, source data is encoded by organizing at least a selected portion of source data into a data block having rows and columns. Encoded columns are formed by appending to each column error correction data derived from that column using a selected error correction code. Encoded rows are formed by appending to each row error correction data derived from that row using a selected error correct code. In an exemplary embodiment, encoded rows of source data (together with appended FEC data) and a first predetermined number of rows of FEC data are transmitted together, such that the first predetermined number of rows is less than all rows of error correction data. In an exemplary embodiment, source data is organized using interleaving.

36 Claims, 6 Drawing Sheets

DEVICES AND SYSTEM FOR EXCHANGE OF DIGITAL HIGH-FIDELITY AUDIO AND VOICE THROUGH A WIRELESS LINK

BACKGROUND

The subject matter disclosed herein relates to communication systems. More particularly, the subject matter disclosed herein relates to a communication system that transports media content with a low error rate and without compressing the media content and thereby losing a portion of the media content.

The reduction in the physical size of memory has allowed consumer electronic (CE) devices to drastically increase the amount of storage contained in a CE device. For example, handheld devices, such as iPod-type device, currently provide enough on-board storage for storing up to 10,000 songs. Consequently, consumers are now able to carry their entire music collection around in such a handheld unit. Accordingly, consumers can enjoy their music collections not just at home, but in a car, at the gym, or at a friend's house. Nevertheless, the available user interface for enjoying the music collection at any given location may vary so that a consumer is required to have several different interface cables in order to connect to different listening devices.

Bluetooth-based communication link allows a consumer to conveniently interface a CE device, such as an iPod-type device, to a listening device, such as a pair of headphones or a pair of speakers. A Bluetooth-based communication link has a disadvantage that Bluetooth cannot stream audio content without compressing and decompressing the audio. Consequently, with a lossy codec, a Bluetooth-based communication link cannot provide a CD-quality experience for a user.

What is needed, among other things addressed by the subject matter disclosed herein, is a technique for providing high-quality media content over a communication link without requiring that the media be compressed for transmission over the communication link.

Further, a wireless communication link is constrained both by availability of transmission bandwidth, as well as by the occurrence of random bit errors due to thermal noise and man-made interferers. On the other hand, delivery of uncompressed high-quality media content requires use of higher bandwidth and absence of bit errors. What is also needed is a mechanism for delivering such high-quality media data over a wireless link with constrained bandwidth, thermal noise and man-made interference with very little loss in fidelity.

BRIEF SUMMARY

The subject matter disclosed herein, among other things, provides a technique for providing high-quality media content over a communication link without requiring that the media be compressed for transmission over the communication link. Additionally, the subject matter disclosed herein provides a mechanism for delivering such high-quality media data over a wireless link with constrained bandwidth, thermal noise and man-made interference with very little loss in fidelity.

Advantages of the subject matter disclosed herein are provided by a system for communicating source data such as audio content or image content, from a data source over a communications link, such as a wireless communications link or a wired communication link. The system includes an encoder and a transmitter. The encoder organizes a selected portion of source data into a data block having rows and columns and forms an encoded column from each column of the data block by appending column error-correction data for the column to the column. The column error-correction data is formed for each column by using a Reed-Solomon code to form the column error-correction data. The encoder also forms an encoded row from each row of the data block and from each row of column error-correction data by appending row error-correction data for the row to the row. The row error-correction data is formed for each row by using a BCH-type code to form the row error-correction data. The transmitter transmits each encoded row and a first predetermined number of rows of column error-correction data of the data block over the communication link. The first predetermined number of rows is less than a total number of rows formed by column error-correction data. The encoder can also interleaves the source data forming the selection portion of the source data. The transmitter further transmits a second predetermined number of rows of column error-correction data when a number of errors contained in the transmitted encoded rows and the first predetermined number of rows of column error-correction data, when received, exceeds an error correction capability of the transmitted row error-correction data and the first predetermined number of rows of column error-correction data. The second predetermined number of rows of column error-correction data is selected from the rows of column error-correction data that were not transmitted with the corresponding encoded rows. In one exemplary embodiment, the second predetermined number of rows is transmitted with at least one encoded row of a subsequent data block.

The source device and the receiver device each include a transmitter and a receiver portion to form a bi-directional link for the purpose of link maintenance. The transmitter of each device transmits information indicating a change in a communication channel, such as a change in the carrier frequency of the communication channel, when a number of errors contained in the transmitted encoded rows, the first predetermined number of rows of column error-correction data and the second predetermined number of rows of column error-correction data, when received, exceeds a predetermined number of errors or if a predetermined number of packets in either direction are lost. A power transmit level of the transmitter is changed when the number of rows in error exceed the first predetermined number of rows of column error-correction data, but do not exceed a sum of the first and second predetermined number of rows of column error-correction data.

In one exemplary embodiment, the data block has 24 rows and 224 columns and the Reed-Solomon code and the BCH-type code are each based on a Galois field of 256 elements. The Reed-Solomon code produces a block of 28 coded symbols for each column of the data block such that four of the coded symbols are column error-correction data, and the BCH-type code produces a block of 248 coded symbols for each row of the data block such that 24 coded symbols are row error-correction data.

In another exemplary embodiment, the source data is organized into data symbols, such that each data symbol is formed by a first predetermined number of data bits. The selected portion of source data is organized by using a second predetermined number of data bits of each data symbol contained in the selected portion of source data. The second predetermined number of data bits is less that the first predetermined number of data bits. The encoder forms an encoded row by appending each encoded row with a third predetermined number of data bits from each data symbol contained in the row, such that the second predetermined number plus the third predetermined number is equal to or less than the first predetermined number of data bits. The transmitter transmits each appended encoded row and the first predetermined number of rows of column error-correction data. In one exemplary configuration, the first predetermined number of data bits is sixteen data bits, the second predetermined number of data bits is fourteen data bits and the third predetermined number is two data bits.

In another exemplary embodiment, the data symbols are formed by pulse code modulated symbols from a multi-channel audio source with the bits are organized in degree of significance such that all bits in a group including the second predetermined number of data bits are of higher significance relative to any bit in a group including of the third predetermined number of data bits. In yet another exemplary configuration, the first predetermined number of data bits is fourteen data bits, and the second predetermined number of bits is fourteen data bits, and the third predetermined number is zero data bits.

In one exemplary embodiment, the source device includes a receiver receiving a data frame containing a payload portion, such that the payload portion contains a selected portion of source data from a listener device.

In another exemplary embodiment, the communication includes a receiver that receives each encoded row and the first predetermined number of rows of column error-correction data of the data block over the communications link. The receiver requests a second predetermined number of rows of column error-correction data to be transmitted when a number of errors contained in the transmitted encoded rows and the first predetermined number of rows of column error-correction data exceeds an error correction capability of the transmitted row error-correction data and the predetermined number of rows of column error-correction data. The second predetermined number of rows of column error-correction data is selected from the rows of column error-correction data that were not transmitted with the encoded rows corresponding to the second predetermined number of rows of column error-correction data.

The subject matter disclosed herein also provides a system for communicating source data, such as audio content or image content, from a data source over a communications link, such as a wireless communications link or a wired communication link, that includes at least one listener device. At least one listener device has a receiver and a transmitter. The receiver receives an encoded data block transmitted over the communication link. The encoded data block is formed by organizing a selected portion of source data into a data block having rows and columns, forming an encoded column from each column of the data block by appending column error-correction data for the column to the column, such that the column error-correction data is formed for each column by using a Reed-Solomon code to form the column error-correction data, forming an encoded row from each row of the data block and from each row of column error-correction data by appending row error-correction data for the row to the row, such that the row error-correction data is formed for each row by using a BCH-type code to form the row error-correction data, and transmitting each encoded row and a first predetermined number of rows of column error-correction data of the data block over the communication link, such that the first predetermined number of rows is less than a total number of rows formed by column error-correction data. The transmitter transmits a request for a second predetermined number of rows of column error-correction data to be transmitted when a number of errors contained in the transmitted encoded rows and the first predetermined number of rows of column error-correction data exceeds an error correction capability of the transmitted row error-correction data and the predetermined number of rows of column error-correction data. The second predetermined number of rows of column error-correction data is selected from the rows of column error-correction data that were not transmitted with the encoded rows corresponding to the second predetermined number of rows of column error-correction data.

Additionally, the subject matter disclosed herein provides a method of communicating source data, such as audio content or image content, from a data source over a communications link, such as a wireless communications link or a wired communication link, in which a selected portion of source data is organized into a data block having rows and columns, an encoded column is formed from each column of the data block by appending column error-correction data for the column to the column, such that the column error-correction data is formed for each column by using a Reed-Solomon code to form the column error-correction data, forming an encoded row is formed from each row of the data block and from each row of column error-correction data by appending row error-correction data for the row to the row, such that the row error-correction data is formed for each row by using a BCH-type code to form the row error-correction data, and each encoded row and a first predetermined number of rows of column error-correction data of the data block are transmitted from a source device over the communication link, such that the first predetermined number of rows is less than a total number of rows formed by column error-correction data. The method further includes transmitting a second predetermined number of rows of column error-correction data when a number of errors contained in the transmitted encoded rows and the first predetermined number of rows of column error-correction data, when received, exceeds an error correction capability of the transmitted row error-correction data and the first predetermined number of rows of column error-correction data, such that the second predetermined number of rows of column error-correction data is selected from the rows of column error-correction data that were not transmitted with the corresponding encoded rows. According to one exemplary aspect of the subject matter disclosed herein, the second predetermined number of rows are transmitted with at least one encoded row of a subsequent data block.

Information indicating a change in a communication channel, such as a change in a carrier frequency of the communication channel, is transmitted when one of a first predetermined number of frame errors occur within a second predetermined number of frames of data interchange between a source device and the listener device and a third predetermined number of consecutive frame errors, a frame error being an event in which one of a number of errors contained in the transmitted encoded rows, the first predetermined number of rows of column error-correction data and the second predetermined number of rows of column error-correction data, when received, exceeds a predetermined number of errors, and a data packet in a reverse direction indicates a retransmission request is lost. A power transmit level is changed when the listener device indicates through use of a data packet in a reverse direction that a signal-to-noise power ratio is insufficient for sustaining an expected number of row errors less than the first predetermined number of rows of column error-correction data.

In one exemplary embodiment, the data samples within the received encoded rows are interpolated when a number of errors contained in the transmitted encoded rows, the first predetermined number of rows of column error-correction data and the second predetermined number of rows of column error-correction data, when received, exceeds a predetermined number of errors. In another exemplary embodiment, a previously received data block is reproduced by reversing and time-domain windowing the previously received data block when a number of errors contained in the transmitted encoded rows, the first predetermined number of rows of column error-correction data and the second predetermined number of rows of column error-correction data, when received, exceeds an error correction capability of the transmitted encoded rows, the first predetermined number of rows of column error-correction data and the second predetermined number of rows of column error-correction data.

In one exemplary embodiment, the data block has 24 rows and 224 columns, and the Reed-Solomon code and the BCH-type code are each based on a Galois field of 256 elements. The Reed-Solomon code produces a block of 28 coded symbols for each column of the data block such that four of the coded symbols are column error-correction data, and the BCH-type code produces a block of 248 coded symbols for each row of the data block such that 24 coded symbols are row error-correction data.

In another exemplary embodiment, the source data is organized into data symbols, such that each data symbol is formed by a first predetermined number of data bits. The selected portion of source data is organized into the data block by using a second predetermined number of data bits of each data symbol contained in the selected portion of source data. The second predetermined number of data bits is less that the first predetermined number of data bits. An encoded row is formed by appending each encoded row with a third predetermined number of data bits from each data symbol contained in the row, such that the second predetermined number plus the third predetermined number are equal to or less than the first predetermined number of data bits. Each appended encoded row and the first predetermined number of rows of column error-correction data are then transmitted. In one exemplary configuration, the first predetermined number of data bits is sixteen data bits, the second predetermined number of data bits is fourteen data bits and the third predetermined number is two data bits.

In still another exemplary embodiment, the source data is organized into data symbols, such that each data symbol is formed by a first predetermined number of data bits. The selected portion of source data is organized into the data block by using the second predetermined number of data bits of each data symbol contained in the selected portion of source data, such that the second predetermined number of data bits is less that the first predetermined number of data bits. In one exemplary configuration, the first predetermined number of data bits is sixteen data bits, and the second predetermined number of bits is fourteen data bits.

BRIEF DESCRIPTION OF THE DRAWINGS

The foregoing is not intended to be an exhaustive list of embodiments and subject matter of the present application. The subject matter disclosed herein is illustrated by way of example and not by limitation in the accompanying figures in which like reference numerals indicate similar elements and in which.

DETAILED DESCRIPTION

Figure 1:
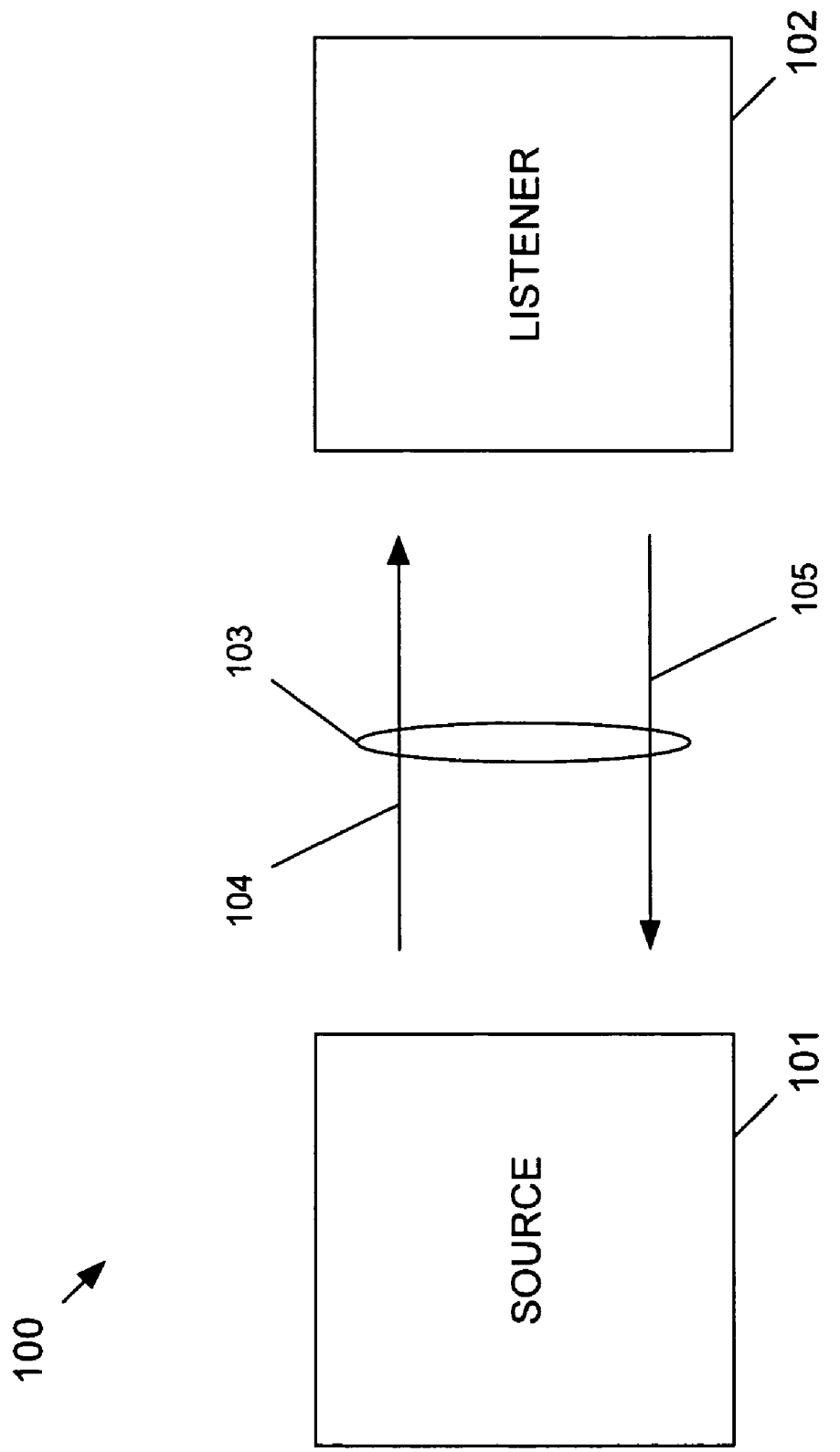
FIG. 1 is a functional block diagram depicting a communication system, or Net.

The subject matter disclosed herein provides a communication system having a source device that is capable of transmitting streaming digital media data, such as multi-channel audio data or digital image data, over a communication link to one or more listener devices. Each listener device receives and reproduces the streaming digital media data in real time in a manner such that random bit errors caused by receiver noise and short bursts of interference are reduced by use of an error correction coding technique. Medium bursts of interference are reduced by the combined use of the error correction coding technique and automatically repeated requests and their responses. Long bursts of interference are reduced through the combined use of the error detection coding technique, interleaving of media samples in time domain, and interpolation of detected bad samples using an interpolation of good and restored samples.

A combination of a source device and one or more listener devices working in co-operation, that is, communicatively coupled by a communication link, is referred to herein as a Net. In any given Net, there can only be one source device. There are two link directions in a communication link or Net. The first link direction is between a source device and a listener device and is referred to herein as a Source-to-Listener (S2L) link. The second link direction is between a listener device and a source device and is referred to herein as a Listener-to-Source (L2S) link. An S2L link is primarily used for carrying stereo audio data from source device to a listener device. An S2L link also carries control information relating to synchronization, control information for maintaining the communication link, and audio-related control information. An L2S link is primarily used for carrying control information relating to synchronization, control information for maintaining the communication link, and audio-related control information. An L2S link also has the capability for carrying voice data back from a listener device to a source device. In one exemplary embodiment of the subject matter disclosed herein, up to eight Nets may exist in close geographical proximity. In other exemplary embodiments, more than eight Nets may exist in close geographical proximity.

A Net can be configured to operate in a Single mode or in a Group mode. The Single mode is the default mode and, consequently, a Net is initially synchronized into Single mode. In the Single mode, a Net includes only one listener device. According to the subject matter disclosed herein, the listener device in a Net operating in the Single mode can include a Talkset configuration. In the Group mode, a Net includes more than one listener device. Each listener device receives the same signal from the source device, but can potentially transmit different control data back to the source device. Thus, in Group mode, a Net has only one Source-to-Listener link, but multiple Listener-to-Source links. Different L2S links in the same Net are time multiplexed with a communication frame as a multiplexing unit.

In one exemplary embodiment, a Net having a listener device having a Talkset configuration can only exist in a Net operating in the Single mode. Accordingly, a listener device that has a Talkset mode cannot be in a Net operating in a Group mode, even when the other listener devices of the Group mode Net are not listener devices having a Talkset configuration. In another exemplary embodiment, the number of listener devices having a talkset configuration in a Net is not so limited.

FIG. 1 is a functional block diagram depicting a communication system, or Net, 100. As shown in FIG. 1, Net 100 includes a source, or transmitter, device 101 and a receiver, or listener, device 102. Source device 101 is communicatively coupled to listener device 102 over a communication link 103. In one exemplary embodiment, communication link 103 is a wireless communication link, such as a radio frequency (RF) communication link or an infrared (IR) communication link. In another exemplary embodiment, communication link 103 is a wired communication link, such as a powerline-based communication link. Although FIG. 1 depicts only one listener device, it should be understood that a communication system 100 according to the subject matter disclosed herein more generally includes a source device 101 and at least one listener device 102. Each listener device 102 is communicatively coupled to source device 101 by communication link 103.

Communication link 103 is established through synchronization of a source device 101 and listener device 102 that recognize each other as part of Net 100. Communication link 103 includes a "forward" S2L link 104 and a "reverse" L2S link 105. S2L link 104 provides a transport of media content and control data from a source device 101 to a listener device 102. According to the subject matter disclosed herein, media content includes digital audio data, such as multi-channel audio data, and/or digital image data. Digital image data can include, but is not limited to, digital image data in a JPEG format, a TIFF format, a PDF format, a bitmap format. L2S link 105 provides a transport of control data and/or voice data from a listener device 102 to a source device 101. In one exemplary embodiment, communication link 103 provides a first type of communication link in which an S2L link 104 carries 2×16 PCM bits of 48 kilosamples per second (ksps) of digital stereo audio data, and a L2S path 105 carries control data.

Another type of communication link provided by the subject matter disclosed herein is o a type of applications, referred to herein as "talkset-type" applications, that carry stereo digital audio content and control data over S2L link 104 and digital voice content and control data over L2S link 105 between a source device 101 and one listener device 102. One exemplary embodiment of a talkset-type of communication link includes an S2L link 104 carrying 2×14 PCM bits of 48 ksps of digital stereo audio data, and a L2S link 105 carrying 1×12 bit PCM of 16 ksps digital voice data and reverse control data. The actual over-the-path data rate may be a higher data rate for accommodating overhead for coding, preamble, transmit/receive slotting, etc. Additionally, it should be understood that media content other than digital audio data could be transported, such as digital image data. For example, digital image data can include, but is not limited to, digital image data in a JPEG format, a TIFF format, a PDF format, a bitmap format.

Figure 2A:
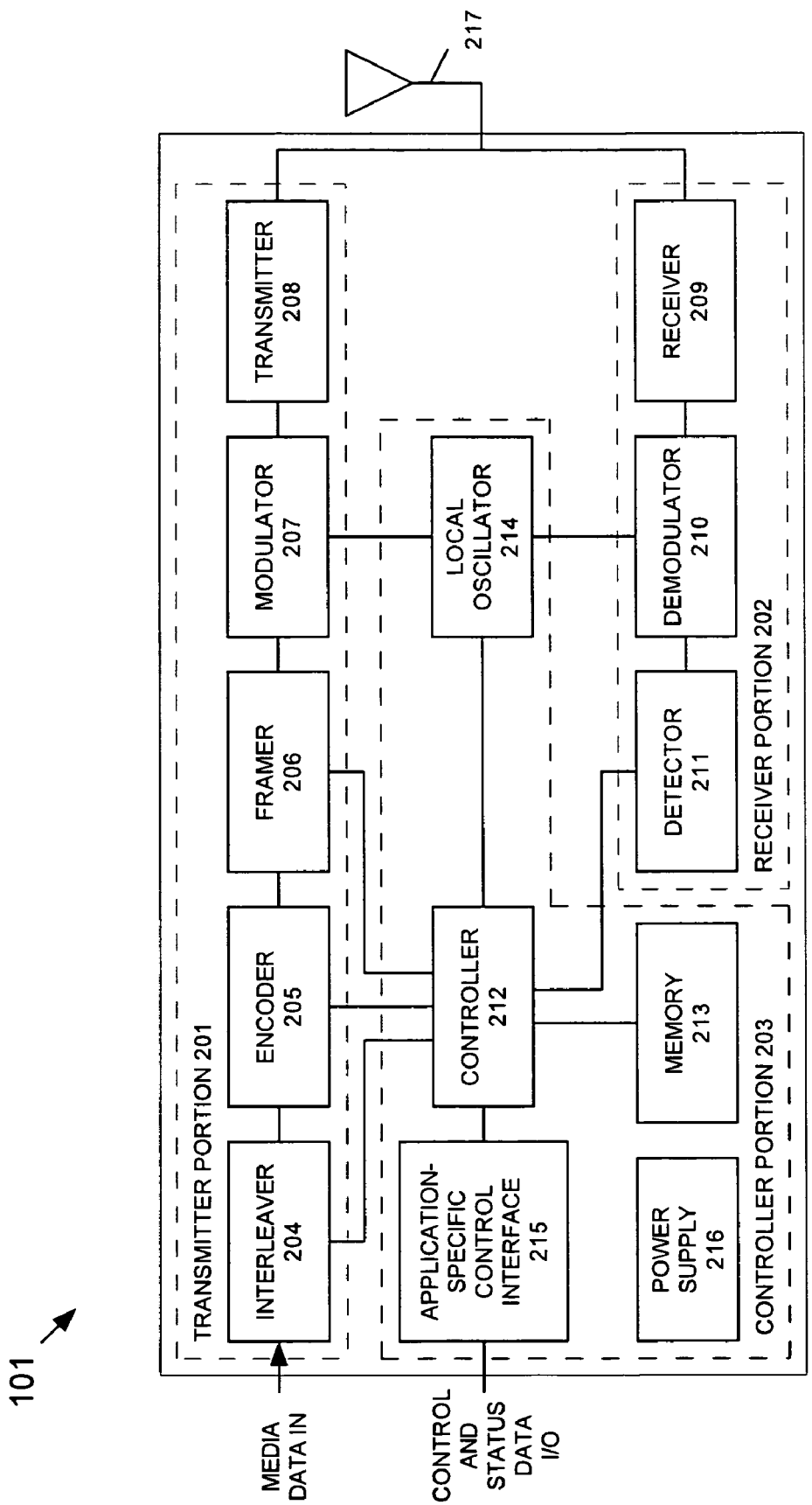
FIG. 2A depicts a more detailed functional block diagram of an exemplary embodiment of a source device.

FIG. 2A depicts a more detailed functional block diagram of an exemplary embodiment of a source device 101. Source device 101 includes a transmitter portion 201, a receiver portion 202 and a controller portion 203. Transmitter portion 201 includes an interleaver 204, an encoder 205, a framer 206, a modulator 207, and a transmitter 208. Receiver portion 202 includes a receiver 209, a demodulator 210 and a detector 211. Controller portion 203 includes a controller 212, a memory 213, a local oscillator 214, an application-specific control interface 215 and a power supply subsystem 216. Source device 101 also includes an antenna 217 that is used by both transmitter portion 201 and receiver portion 202 for coupling to a communication link 103 (FIG. 1).

Interleaver 204 interleaves input media data for reducing the effects of interference that can be introduced, for example, during transmission over the S2L link. Encoder 205 encodes the interleaved media data for further reducing the effects of interference. Framer 206 forms an appropriate frame structure using an equal number for bits for each frame taken from the interleaved and encoded media data to form each frame. It should be understood that frame structures having different numbers of bits for each different frame could also be used. Modulator 207 modulates the frame data in a well-known manner. In one exemplary embodiment, modulator 207 uses a π/4-DQPSK modulation technique. It should be understood that other modulation techniques could alternatively be used. Transmitter 208 transmits the modulated frame data in a well-known manner through antenna 217 over an S2L link 104 of a communication link 103 (FIG. 1) for each of the four different types of communications links according to the subject matter disclosed herein. Additional details regarding interleaver 204, encoder 205, framer 206, modulator 207 and transmitter 208 are provided below.

Receiver 209 receives through antenna 217 control data from a L2S link 105 of a communication link 103 for the first three types of communications links, and voice data and control data for the fourth type of communication link. Demodulator 210 demodulates the received data in a well-known manner. In one exemplary embodiment, demodulator 210 uses a π/4-DQPSK modulation technique. It should be understood that other modulation techniques could be used for L2S link 105 and, consequently, corresponding demodulation techniques would be used by demodulator 210. Detector 211 detects the demodulated data for use by controller portion 203.

Controller 212 controls the overall operation of source device 101 based on the operational states of transmitter portion 201, receiver portion 202, control data received from a reverse path of a communication link, and inputs received from application-specific control interface 215. Memory 213 contains data, such as state data and/or data in the form of machine-executable instructions, that are used by controller 212 for controlling the overall operation of source device 101. Local oscillator 214 generates one or more modulation frequencies used by modulator 207 and demodulator 210. Local oscillator 214 is controlled by controller 212 based on operating states detected by controller 212, control data received from a reverse path 105, and/or input received from application-specific control interface 215.

Application-specific control interface 215 receives inputs for controlling such functions as, power on/off, and for providing indications of operating mode states related to power on/off.

Power supply subsystem 216 provides power to the various functional blocks of source device 101, although not explicitly shown in FIG. 1.

It should be understood that the various functional blocks of source device 101 can be embodied in a single integrated circuit, such as an Application Specific Integrated Circuit (ASIC) or a module, or in separate integrated circuits or ASICs. Additionally or alternatively, selected functional blocks can be embodied as a state machine, or as a processor that executes machine-readable instructions for performing the selected functions.

Figure 2B:
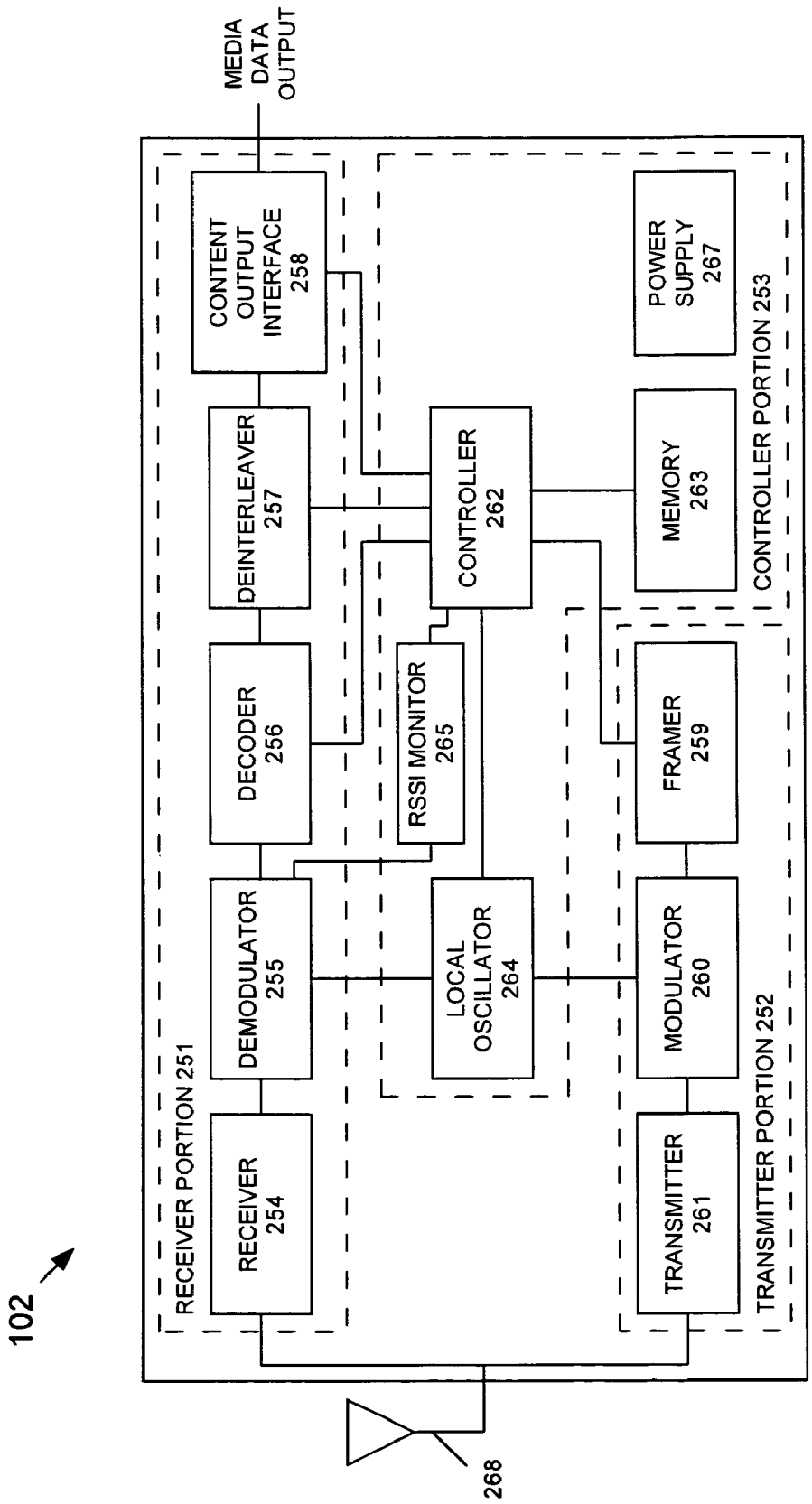
FIG. 2B depicts a more detailed functional block diagram of an exemplary listener device.

FIG. 2B depicts a more detailed functional block diagram of an exemplary listener device 102. Listener device 102 includes a receiver portion 251, a transmitter portion 252, and a controller portion 253. Receiver portion 251 includes a receiver 254, a demodulator 255, a decoder 256, a de-interleaver 257 and a content output interface 258. Transmitter portion 252 includes a framer 259, a modulator 260, and a transmitter 261. Controller portion 253 includes a controller 262, a memory 263, a local oscillator 264, an RSSI monitor 265 and a power supply subsystem 267. Both receiver portion 251 and transmitter portion 252 use an antenna 268 for coupling to a communication link 103 (FIG. 1).

Receiver 254 receives modulated frame data through antenna 268 from an S2L link 104 of a communication link 103 (FIG. 1). The received modulated frame data is demodulated by demodulator 255 in a well-known manner. In one exemplary embodiment, demodulator 255 uses a π/4-DQPSK modulation technique. It should be understood that other modulation techniques could be used for S2L link 104 and, consequently, corresponding demodulation techniques would be used by demodulator 255. The demodulated frame data is decoded by decoder 256. De-interleaver 257 deinterleaves the decoded data. Additional details regarding demodulator 255, decoder 256, and de-interleaver 257 are provided below.

Content output interface 258 outputs decoded media content in an application-specific manner. For example, when listener device 102 is embodied as pair of headphone and the media content is digital stereo audio data, content output interface 258 provides a digital-to-analog function capability for converting the digital-based stereo audio data to an analog-based audio signal and a transducer function for converting the analog-based audio signal to sound. As another example, when listener device 102 can be configured in a talkset mode, content output interface 258 provides a digital-to-analog function capability for converting the digital-based stereo audio data to an analog-based audio signal and a transducer function for converting the analog-based audio signal to sound.

Framer 259 forms an appropriate control frame structure an equal number for bits for each reverse path frame for sending control data to a source device. Framer 259 also forms an appropriate voice-data-type frame structure an equal number for bits for each frame for sending voice data and control data when listener device 102 is configured for a talkset mode. It should be understood that reverse path frame structures having different numbers of bits for each different frame could also be used. Modulator 260 modulates the frames in a well-known manner. In one exemplary embodiment, modulator 260 uses a π/4-DQPSK modulation technique. It should be understood that other modulation techniques could alternatively be used. Transmitter 261 transmits the modulated frame data through antenna 267 over a L2S link 105 of a communication link 103.

Controller 262 controls the overall operation of listener device 102 based on the operational states of receiver portion 251, transmitter portion 252, control data received from an S2L link of a communication link, and inputs received from application-specific control interface 265. Memory 263 contains data, such as state data and/or data in the form of machine-executable instructions, that are used by controller 262 for controlling the overall operation of source device 102. Local oscillator 264 generates one or more modulation frequencies used by demodulator 255 and modulator 260. Local oscillator 264 is controlled by controller 262 based on operating states detected by controller 262, control data received from a forward path 104. RSSI monitor 265 detects the received strength of interference on the different channels forming communication link 103. Power supply subsystem 267 provides power to the various functional blocks of listener device 102, although not explicitly shown in FIG. 1.

An exemplary communication system according to the subject matter disclosed herein utilizes a closed-loop adaptive-frequency hopping technique. A listener device monitors the Signal-to-Interference Ratio (SIR) on the current channel while detecting the Received Signal Strength Indicator (RSSI) relating to interference on the other channels. Based on the monitored SIR, the listener device determines whether the SIR is sufficient for a link to be maintained on the present channel. When the link SIR falls below a predetermined threshold, the listener device sends request for the source device to increase the transmit power level. Additionally, when another channel has a potential link quality that is better than the present channel, the listener device indicates the frequency of the better channel at the time the increase in transmit power is requested. When there are more than a given number of errors within a predetermined time period, the source device sends an indication of an impending frequency switch to the listener device. When the listener device receives confirmation of the frequency switch, the listener device responds by indicating permission for changing the frequency, to which the source device responds by changing the frequency.

It should be understood that the various functional blocks of listener device 102 can be embodied in a single integrated circuit, such as an Application Specific Integrated Circuit (ASIC) or a module, or in separate integrated circuits or ASICs. Additionally or alternatively, selected functional blocks can be embodied as a state machine, or as a processor that executes machine-readable instructions for performing the selected functions.

Interleaver 204 in FIG. 2A receives streaming digital media content, such as digital audio data or digital image data, in the form of data samples. Interleaver 204 arranges the samples into an interleaved sample data block that is encoded by encoder 205. In one exemplary embodiment, each sample includes a 16-bit digital audio left stereo channel sample and a corresponding 16-bit digital audio right stereo channel sample. For that exemplary embodiment, interleaver 204 is a row-column interleaver that forms an interleaved data block of 192 symbols having 24 rows and 8 columns. Interleaver 204 selects the particular digital media samples that form each row of the data block. Initially, interleaver 204 selects the first media samples arriving at interleaver 204 to be the first symbol of the first row of the interleaved data block. The next media sample that is selected is the sample that arrives 24 consecutive samples later, and so forth, so that each subsequent column of the row contains the sample that arrives 24 consecutive samples after the sample of the previous row. The rows are arranged in groups of four, in which each consecutive row in a group has samples that are six samples apart from the previous row in the group. The samples in the first rows of consecutive groups are one sample apart from each other. Table 2 depicts an exemplary sequence of sample interleaving.

TABLE 2

An exemplary sequence of sample interleaving.

| GROUP | ROW | SAMPLE POSITION NUMBER | | | | | | | |
|---|---|---|---|---|---|---|---|---|---|
| 1 | 1 | 0 | 24 | 48 | 72 | 96 | 120 | 144 | 168 |
|   | 2 | 6 | 30 | 54 | 78 | 102 | 126 | 150 | 174 |
|   | 3 | 12 | 36 | 60 | 84 | 108 | 132 | 156 | 180 |
|   | 4 | 18 | 42 | 66 | 90 | 114 | 138 | 162 | 186 |
| 2 | 5 | 1 | 25 | 49 | 73 | 97 | 121 | 145 | 169 |
|   | 6 | 7 | 31 | 55 | 79 | 103 | 127 | 151 | 175 |
|   | 7 | 13 | 37 | 61 | 85 | 109 | 133 | 157 | 181 |
|   | 8 | 19 | 43 | 67 | 91 | 115 | 139 | 163 | 187 |
| 3 | 9 | 2 | 26 | 50 | 74 | 98 | 122 | 146 | 170 |
|   | 10 | 8 | 32 | 56 | 80 | 104 | 128 | 152 | 176 |

TABLE 2-continued

An exemplary sequence of sample interleaving.

| GROUP | ROW | SAMPLE POSITION NUMBER | | | | | | | |
|---|---|---|---|---|---|---|---|---|---|
| | 11 | 14 | 38 | 62 | 86 | 110 | 134 | 158 | 182 |
| | 12 | 20 | 44 | 68 | 92 | 116 | 140 | 164 | 188 |
| 4 | 13 | 3 | 27 | 51 | 75 | 99 | 123 | 147 | 171 |
| | 14 | 9 | 33 | 57 | 81 | 105 | 129 | 153 | 177 |
| | 15 | 15 | 39 | 63 | 87 | 111 | 135 | 159 | 183 |
| | 16 | 21 | 45 | 69 | 93 | 117 | 141 | 165 | 189 |
| 5 | 17 | 4 | 28 | 52 | 76 | 100 | 124 | 148 | 172 |
| | 18 | 10 | 34 | 58 | 82 | 106 | 130 | 154 | 178 |
| | 19 | 16 | 40 | 64 | 88 | 112 | 136 | 160 | 184 |
| | 20 | 22 | 46 | 70 | 94 | 118 | 142 | 166 | 190 |
| 6 | 21 | 5 | 29 | 53 | 77 | 101 | 125 | 149 | 173 |
| | 22 | 11 | 35 | 59 | 83 | 107 | 131 | 155 | 179 |
| | 23 | 17 | 41 | 65 | 89 | 113 | 137 | 161 | 185 |
| | 24 | 23 | 47 | 71 | 95 | 119 | 143 | 167 | 191 |

The exemplary mathematical sequence in which the samples in Table 2 are selected for the interleaved data block can be expressed as $$k_n = \mathrm{mod}(n,8)*24 + \mathrm{mod}(\mathrm{fix}(n/8),4)*6 + \mathrm{fix}(n/32) \quad (1)$$

in which $k_n$ represents the sequence in which samples are selected for the interleaved data block. It should be understood that alternative mathematical sequences could be used for selecting the interleaving order of the received samples.

Encoder 205 organizes the interleaved sample data block into a symbol block having rows and columns that is encoded. An encoded column is formed from each column of the data block by appending column error correction data for the column to the column. The column error correction data is formed for each column by using a Reed-Solomon code to encode the column. An encoded row is formed from each row of the data block and from each row of column error correction data by appending row error correction data for the row to the row. The row error correction data is formed for each row by using a BCH-type code to form the row error correction data. Although, in this exemplary embodiment, a Reed-Solomon code is employed to form column error correction data for each column (i.e., yielding additional rows) and a BCH-type code is employed to form row error correction data (i.e., yielding additional columns appended to the rows), it is contemplated to employ such and/or other types and/or implementations of channel codes for the purposes of forward error correction directed to either/both of the rows and/or columns (and/or other dimensions of a sample data block). It is also contemplated to employ other forms of interleaving, including omitting to interleave, either at all times or from time to time during operation.

Each encoded row and a first predetermined number of rows of column error correction data are inserted into the payload portion of an S2L Active frame for transmission over the communication link. In one exemplary embodiment, the first predetermined number of rows is less than a total number of rows formed by column error correction data. For this exemplary embodiment, a second predetermined number of rows of column error correction data are transmitted as part of a payload portion of a subsequent S2L Active frame when a number of errors contained in the transmitted encoded rows and the first predetermined number of rows of column error correction data, when received, exceeds an error correction capability of the transmitted row error correction data and the first predetermined number of rows of column error correction data. The second predetermined number of rows of column error correction data is selected from the rows of column error correction data that were not transmitted with the corresponding encoded rows.

Each row of the interleaved data block is used to form a corresponding row of a coding block by using the corresponding bits of each symbol in an interleaved data block row to form a coding symbol. For example, the MSBs of each of the symbols appearing in Row 1 of Table 2 are used to form a coding block symbol. Each of the remaining bits of the symbols is similarly used to form a corresponding coding block symbol.

In an exemplary embodiment, each encoded row and a first predetermined number of rows of column error-correction data are inserted into the payload portion of a S2L Active frame for transmission over the communication link. To illustrate, the first predetermined number of rows may be less than a total number of rows formed by column error-correction data. In this illustration, a second predetermined number of rows of column error-correction data are transmitted as part of a payload portion of a subsequent S2L Active frame when a number of errors contained in the transmitted encoded rows and the first predetermined number of rows of column error-correction data, when received, exceeds an error correction capability of the transmitted row error-correction data and the first predetermined number of rows of column error-correction data. In that case, the second predetermined number of rows of column error-correction data typically is selected from the rows of column error-correction data that were not transmitted with the corresponding encoded rows. Although, as described here, each encoded row is inserted into the payload of an S2L Active frame, it is to be contemplated that the encoded rows may be inserted into a plurality of such frames.

Figure 3:
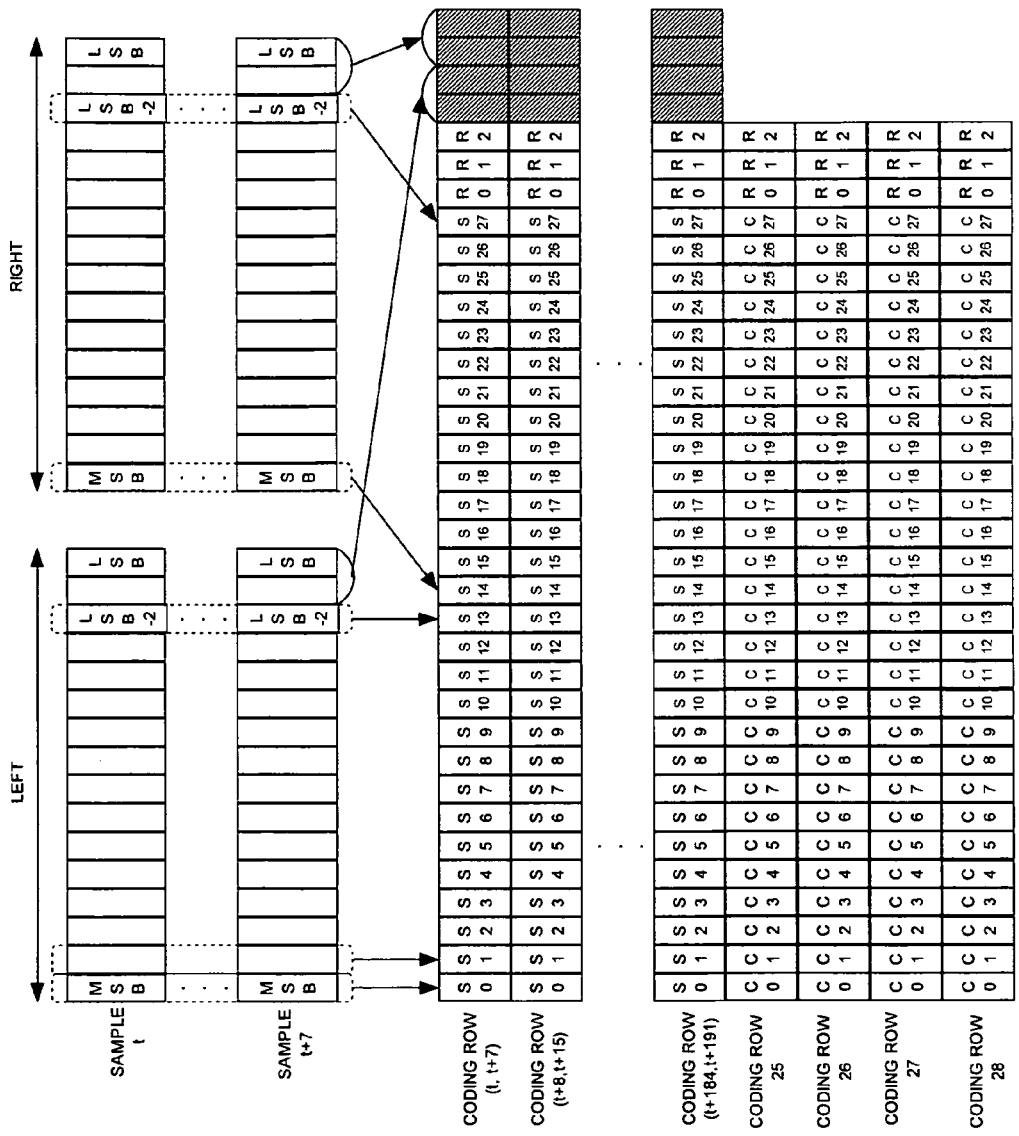
FIG. 3 depicts an exemplary coding technique for coding the exemplary interleaved data block of Table 2.
Figure 4A:
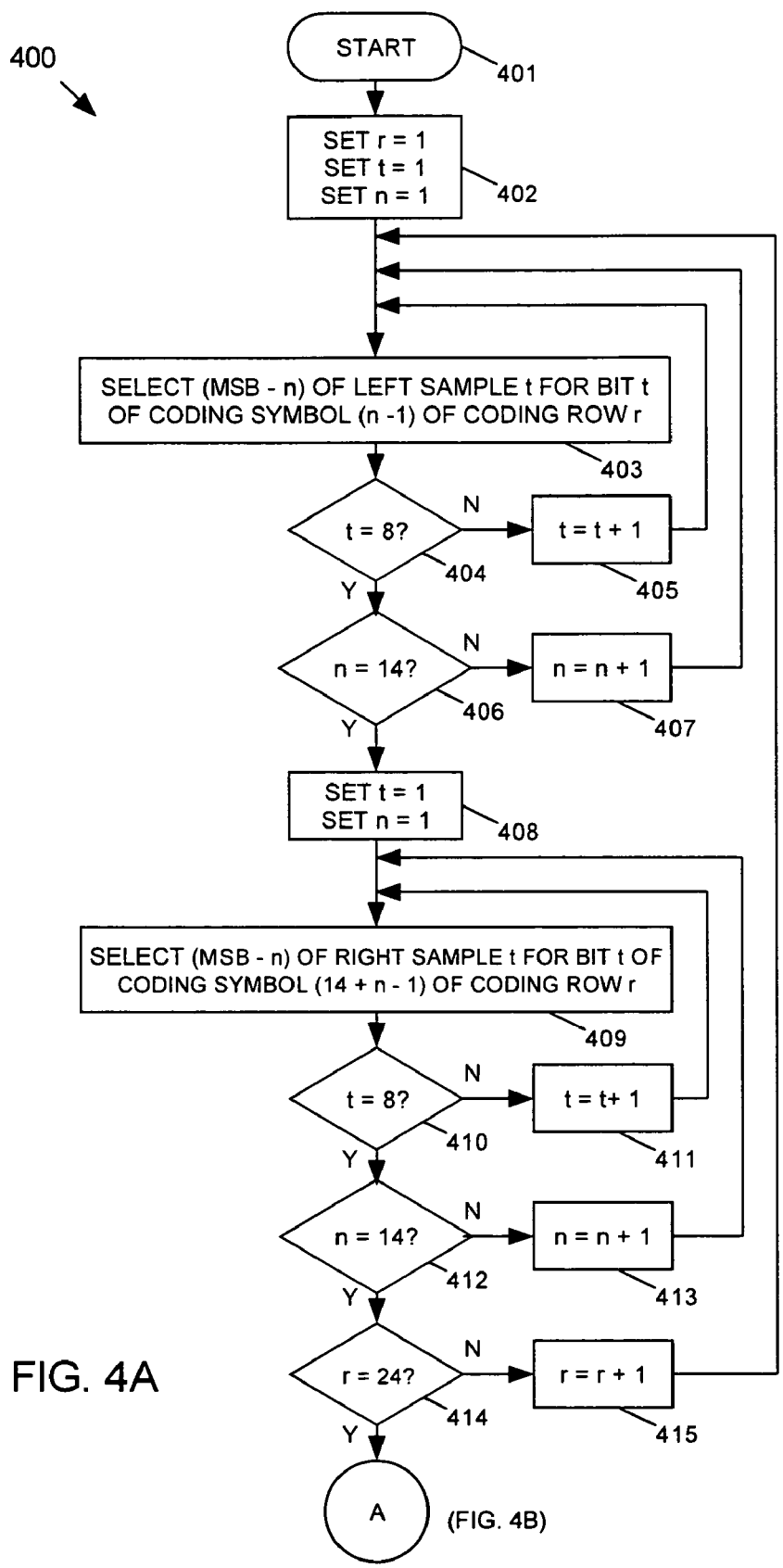
FIGS. 4A and 4B are a flow diagram corresponding to the exemplary coding technique shown in FIG. 3.
Figure 4B:
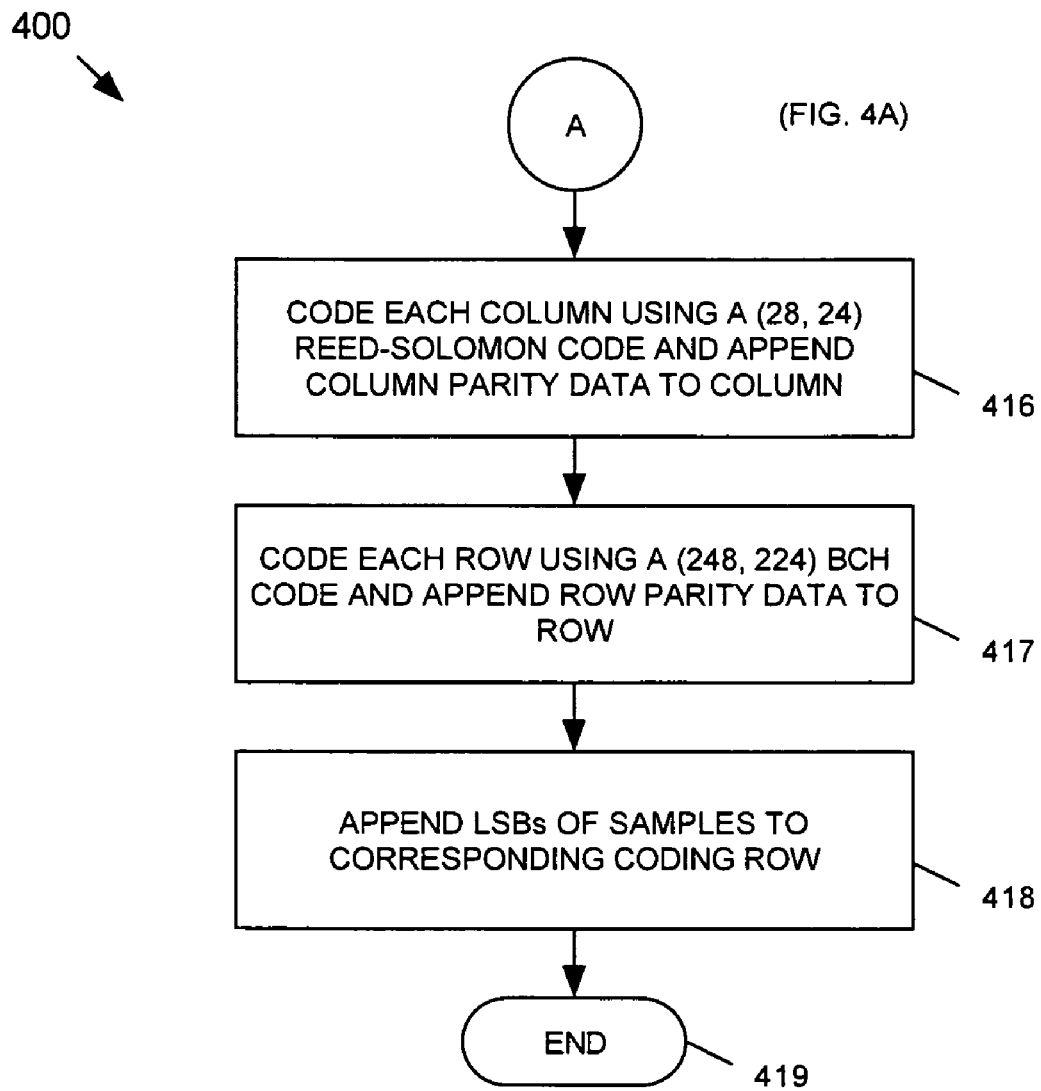

FIG. 3 depicts an exemplary coding technique for coding the exemplary interleaved data block of Table 2. FIGS. 4A and 4B are a flow diagram 400 corresponding to the exemplary coding technique shown in FIG. 3. The process begins at step 401. At step 402, coding row number r is set to equal 1, and indices t and n are each set to equal 1. At step 403, the (MSB-n) bit of the left portion of sample t is selected for bit t of coding symbol (n-1) of coding row 1. At step 404, it is determined whether index t equals 8. If not, flow continues to step 405 where index t is incremented by 1 and the process returns to step 403. If, at step 404, index t equals 8, flow continues to step 406 where it is determined whether index n equals 14.

At this point, when coding row number r equals 1, index t equals 8 and index n equals 1, the first coding symbol for the coding row 1 has been formed. This is depicted in FIG. 3 by the dotted line around the MSBs of left samples t through t+7 and the arrow pointing to coding symbol S0 in coding row (t, t+7). Sample t, shown at the top of FIG. 3, represents the first interleaved sample appearing in Row 1 of Table 2. Sample t+7, shown below sample t in FIG. 3, represents the eighth interleaved sample appearing in Row 1 of Table 2. The left and right channel portions of samples t and t+7 are shown separated for clarity.

If, at step 404, index n does not equal 14, flow continues to step 407 where index n is incremented by 1 and the process returns to step 403. If, at step 406, index n equals 14, flow continues to step 408. At this point, when coding row number r equals 1, index t equals 8 and index n equals 14, the fourteenth coding symbol S13 of coding row (t, t+7) has been formed. By determining whether index n equals 14, the 2-LSBs of each of the left interleaved samples t through t+7 has been skipped. These bits will be used later, as described below.

At step 408, indices t and n are each set equal to one. At step 409, the (MSB−n) bit of the right portion of sample t is selected for bit t of coding symbol (14 +n−1) of coding row 1. At step 410, it is determined whether index t equals 8. If not, flow continues to step 411 where index t is incremented by 1 and the process returns to step 409. If, at step 411, index t equals 8, flow continues to step 412 where it is determined whether index n equals 14. At this point, when coding row number r equals 1, index t equals 8 and index n equals 1, the fifteenth coding symbol for the coding row 1 has been formed. This is depicted in FIG. 3 by the dotted line around the MSBs of right samples t through t+7 and the arrow pointing to coding symbol S14 in coding row (t, t+7). Again, by determining whether index n equals 14, the 2-LSBs of each of the right interleaved samples t through t+7 has been skipped. These bits will be used later, as described below.

If, at step 412, index n does not equal 14, flow continues to step 413 where index n is incremented by 1 and the process returns to step 409. If, at step 412, index n equals 14, flow continues to step 414. At this point, when coding row number r equals 1, index t equals 8 and index n equals 14, the 28th coding symbol S27 of coding row (t, t+7) has been formed.

At step 414, it is determined whether coding row number r equals 24. If not, flow continues to step 415 where coding row number r is incremented by 1 and the process returns to step 403. Each time that the process arrives at step 414, the 28 coding symbols of another coding row have been formed. This is depicted in FIG. 3 as additional coding rows appearing below coding row (t, t+7).

If, at step 414, it is determined that coding row number equals 24, flow continues to step 416 in FIG. 4B. At this point, all coding rows have been formed and a coding block of 24 rows of 28 8-bit symbols, that is, a coding block having 24 rows and 28 columns. At step 416, each column of the coding block is coded using a (28, 24) Reed-Solomon code b based on a Galois field of 256 elements to form column error-correction data C for each column. The column error-correction data C for a column is appended to the column. This is depicted in FIG. 3 by the four additional coding rows, specifically, Coding Rows 25-28.

At step 417, each of the 28 coding rows of the coding block is coded using an $8^{th}$ order (248,224) BCH code based on a Galois field of 256 elements to form 24-bits of row error-correction data R for the row, which is appended to the coding row. This is depicted in FIG. 3 by row error-correction R0-R3 appended to each coding row after symbol S27. Flow continues to step 418 where the 2-LSBs for both the left and right channels that were skipped when the first 24 coding rows were formed are appended to the corresponding coding row to form an encoded row having 280 bits. This is depicted by the cross-hatched symbols appearing at the right side of Coding Rows (t, t+7) through (t+184, t+191). The process ends at step 419. It should be understood that the foregoing coding technique is an exemplary coding technique and that other coding techniques can alternatively be used with the subject matter disclosed herein.

In this exemplary embodiment, the first 26 encoded rows of the encoded data block, that is, the 24 rows of encoded media data and first two rows of the encoded column error-correction data are sent to a listener device as the payload portion of an S2L Active frame. The last encoded rows of column error-correction data are determined at by source device, but not ordinarily sent. When a L2S Active Frame indicates an error in the previous S2L frame, however, these two rows of encoded column error-correction data are typically sent as the first two encoded rows in the payload portion of the next S2L Active frame. To complete the payload portion of the S2L Active frame, the 24 rows of encoded media data are used. Column error-correction data corresponding to the 24 rows of encoded media data is not typically sent.

Persons of ordinary skill in the art will recognize modifications and variations that are possible in the details and arrangements of the exemplary embodiments set forth above, including the various parts and actions thereof, and that such modifications and variations may be practiced that are within the scope of the appended claims. Accordingly, the exemplary embodiments are to be considered as illustrative, and not restrictive or exhaustive.

Moreover, the subject matter disclosed herein is not, and is not to be, limited to the exemplary embodiments, or the details and arrangements, disclosed herein, and the claims may be modified within the scope and equivalents of the original filing.

What is claimed is:

1. A system for communicating source data from a data source over a communications link, comprising a source device, the source device including:

an encoder organizing a selected portion of source data into a data block having rows and columns, the encoder forming an encoded column from each column of the data block by appending column error-correction data for the column to the column, the column error-correction data being formed for each column by using a Reed-Solomon code to form the column error-correction data, and forming an encoded row from each row of the data block and from each row of column error-correction data by appending row error-correction data for the row to the row, the row error-correction data being formed for each row by using a BCH-type code to form the row error-correction data; and a transmitter transmitting each encoded row and a first predetermined number of rows of column error-correction data of the data block over the communication link, the first predetermined number of rows being less than a total number of rows formed by column error-correction data.

2. The system according to claim 1, wherein the transmitter of the source device further transmits a second predetermined number of rows of column error-correction data when a number of errors contained in the transmitted encoded rows and the first predetermined number of rows of column error-correction data, when received, exceeds an error correction capability of the transmitted row error-correction data and the first predetermined number of rows of column error-correction data, the second predetermined number of rows of column error-correction data being selected from the rows of column error-correction data that were not transmitted with the corresponding encoded rows.

3. The system according to claim 2, wherein the second predetermined number of rows are transmitted with at least one encoded row of a subsequent data block when the number of rows in error exceed the first predetermined number of rows of column error-correction data, but do not exceed a sum of the first and second predetermined number of rows of column error-correction data.

4. The system according to claim 2, wherein the transmitter further transmits information indicating a change in a communication channel when one of a first predetermined number of frame errors occur within a second predetermined number of frames of data interchange between the source device and a listener device and a third predetermined number of consecutive frame errors, a frame error being an event in which one of a number of errors contained in the transmitted encoded rows, the first predetermined number of rows of column error-correction data and the second predetermined number of rows of column error-correction data, when received, exceeds a predetermined number of errors, or a data packet in a reverse direction indicating a retransmission request is lost.

5. The system according to claim 4, wherein the change in the communication channel includes a change in carrier frequency of the communication channel.

6. The system according to claim 2, wherein a power transmit level of the transmitter is changed when a listener device indicates that a signal-to-noise power ratio is insufficient for sustaining an expected number of row errors less than the first predetermined number of rows of column error-correction data.

7. The system according to claim 1, wherein the data block has 24 rows and 224 columns,
wherein the Reed-Solomon code and the BCH-type code are each based on a Galois field of 256 elements,
wherein the Reed-Solomon code produces a block of 28 coded symbols for each column of the data block such that four of the coded symbols are column error-correction data, and
wherein the BCH-type code produces a block of 248 coded symbols for each row of the data block such that 24 coded symbols are row error-correction data.

8. The system according to claim 1, wherein the source data is organized into data symbols, each data symbol being formed by a first predetermined number of data bits,
wherein the selected portion of source data is organized by using a second predetermined number of data bits of each data symbol contained in the selected portion of source data, the second predetermined number of data bits being less that the first predetermined number of data bits;
wherein the encoder forms an encoded row by appending each encoded row with a third predetermined number of data bits from each data symbol contained in the row, the second predetermined number plus the third predetermined number being equal to or less than the first predetermined number of data bits, and
wherein the transmitter transmits each appended encoded row and the first predetermined number of rows of column error-correction data.

9. The system according to claim 8, wherein the first predetermined number of data bits is sixteen data bits, the second predetermined number of data bits is fourteen data bits and the third predetermined number is two data bits.

10. The system according to claim 8, wherein the data symbols are formed by of pulse code modulated symbols from a multi-channel audio source with the bits are organized in degree of significance such that all bits in a group including the second predetermined number of data bits are of higher significance relative to any bit in a group including of the third predetermined number of data bits.

11. The system according to claim 10, wherein the first predetermined number of data bits is fourteen data bits, and the second predetermined number of bits is fourteen data bits, and the third predetermined number is zero data bits.

12. The system according to claim 1, wherein the source device further comprises a receiver receiving a data frame containing a payload portion, the payload portion containing a selected portion of source data from a listener device.

13. The system according to claim 1, wherein the communications link is one of a wireless communications link and a wired communication link.

14. The system according to claim 1, wherein the encoder interleaves the source data forming the selection portion of the source data, such that if any predetermined number of consecutive rows are lost, the immediately preceding and succeeding bits of any data samples thus lost will have no errors.

15. The system according to claim 1, wherein the source data includes one of audio content and image content.

16. The system according to claim 1, further comprising at least one listener device including a receiver receiving each encoded row and the first predetermined number of rows of column error-correction data of the data block over the communications link, the receiver requesting a second predetermined number of rows of column error-correction data to be transmitted when a number of errors contained in the transmitted encoded rows and the first predetermined number of rows of column error-correction data exceeds an error correction capability of the transmitted row error-correction data and the predetermined number of rows of column error-correction data, the second predetermined number of rows of column error-correction data being selected from the rows of column error-correction data that were not transmitted with the encoded rows corresponding to the second predetermined number of rows of column error-correction data.

17. A system for communicating source data from a data source over a communications link, comprising at least one listener device including:
a receiver receiving an encoded data block transmitted over the communication link, the encoded data block being formed by
organizing a selected portion of source data into a data block having rows and columns;
forming an encoded column from each column of the data block by appending column error-correction data for the column to the column, the column error-correction data being formed for each column by using a Reed-Solomon code to form the column error-correction data;
forming an encoded row from each row of the data block and from each row of column error-correction data by appending row error-correction data for the row to the row, the row error-correction data being formed for each row by using a BCH-type code to form the row error-correction data; and
transmitting each encoded row and a first predetermined number of rows of column error-correction data of the data block over the communication link, the first predetermined number of rows being less than a total number of rows formed by column error-correction data; and
a transmitter transmitting a request for a second predetermined number of rows of column error-correction data to be transmitted when a number of errors contained in the transmitted encoded rows and the first predetermined number of rows of column error-correction data exceeds an error correction capability of the transmitted row error-correction data and the predetermined number of rows of column error-correction data, the second predetermined number of rows of column error-correction data being selected from the rows of column error-correction data that were not transmitted with the encoded rows corresponding to the second predetermined number of rows of column error-correction data.

18. A method of communicating source data from a data source over a communications link, the method comprising:
organizing a selected portion of source data into a data block having rows and columns;
forming an encoded column from each column of the data block by appending column error-correction data for the column to the column, the column error-correction data being formed for each column by using a Reed-Solomon code to form the column error-correction data;

forming an encoded row from each row of the data block and from each row of column error-correction data by appending row error-correction data for the row to the row, the row error-correction data being formed for each row by using a BCH-type code to form the row error-correction data; and transmitting from a source device each encoded row and a first predetermined number of rows of column error-correction data of the data block over the communication link, the first predetermined number of rows being less than a total number of rows formed by column error-correction data.

19. The method according to claim 18, further comprising transmitting a second predetermined number of rows of column error-correction data when a number of errors contained in the transmitted encoded rows and the first predetermined number of rows of column error-correction data, when received, exceeds an error correction capability of the transmitted row error-correction data and the first predetermined number of rows of column error-correction data, the second predetermined number of rows of column error-correction data being selected from the rows of column error-correction data that were not transmitted with the corresponding encoded rows.

20. The method according to claim 19, wherein the second predetermined number of rows are transmitted with at least one encoded row of a subsequent data block.

21. The method according to claim 19, further comprising transmitting information indicating a change in a communication channel when one of a first predetermined number of frame errors occur within a second predetermined number of frames of data interchange between a source device and the listener device and a third predetermined number of consecutive frame errors, a frame error being an event in which one of a number of errors contained in the transmitted encoded rows, the first predetermined number of rows of column error-correction data and the second predetermined number of rows of column error-correction data, when received, exceeds a predetermined number of errors, and a data packet in a reverse direction indicates a retransmission request is lost.

22. The method according to claim 21, wherein the change in the communication channel includes a change in a frequency of the communication channel.

23. The method according to claim 19, further changing a power transmit level when the listener device indicates through use of a data packet in a reverse direction that a signal-to-noise power ratio is insufficient for sustaining an expected number of row errors less than the first predetermined number of rows of column error-correction data.

24. The method according to claim 19, further comprising interpolating data samples within the received encoded rows when a number of errors contained in the transmitted encoded rows, the first predetermined number of rows of column error-correction data and the second predetermined number of rows of column error-correction data, when received, exceeds a predetermined number of errors.

25. The method according to claim 19, further comprising reproducing a previously received data block by reversing and time-domain windowing the previously received data block when a number of errors contained in the transmitted encoded rows, the first predetermined number of rows of column error-correction data and the second predetermined number of rows of column error-correction data, when received, exceeds an error correction capability of the transmitted encoded rows, the first predetermined number of rows of column error-correction data and the second predetermined number of rows of column error-correction data.

26. The method according to claim 18, wherein the data block has 24 rows and 224 columns, wherein the Reed-Solomon code and the BCH-type code are each based on a Galois field of 256 elements, wherein the Reed-Solomon code produces a block of 28 coded symbols for each column of the data block such that four of the coded symbols are column error-correction data, and wherein the BCH-type code produces a block of 248 coded symbols for each row of the data block such that 24 coded symbols are row error-correction data.

27. The method according to claim 18, wherein the source data is organized into data symbols, each data symbol being formed by a first predetermined number of data bits, wherein organizing the selected portion of source data into the data block includes organizing the selected portion of source data by using a second predetermined number of data bits of each data symbol contained in the selected portion of source data, the second predetermined number of data bits being less that the first predetermined number of data bits;

wherein forming an encoded row includes appending each encoded row with a third predetermined number of data bits from each data symbol contained in the row, the second predetermined number plus the third predetermined number being equal to or less than the first predetermined number of data bits, and wherein transmitting includes transmitting each appended encoded row and the first predetermined number of rows of column error-correction data.

28. The method according to claim 27, wherein the first predetermined number of data bits is sixteen data bits, the second predetermined number of data bits is fourteen data bits and the third predetermined number is two data bits.

29. The method according to claim 18, wherein the source data is organized into data symbols, each data symbol being formed by a first predetermined number of data bits, and wherein organizing the selected portion of source data into the data block includes organizing the selected portion of source data into the data block by using the second predetermined number of data bits of each data symbol contained in the selected portion of source data, the second predetermined number of data bits being less that the first predetermined number of data bits.

30. The method according to claim 29, wherein the first predetermined number of data bits is sixteen data bits, and the second predetermined number of bits is fourteen data bits.

31. The method according to claim 18, further comprising receiving a data frame containing a payload portion, the payload portion containing a selected portion of source data from a listener device.

32. The method according to claim 18, wherein the communications link is one of a wireless communications link and a wired communication link.

33. The method according to claim 18, wherein organizing the selected portion of source data into a data block includes interleaving the source data forming the selection portion of the source data.

34. The method according to claim 18, wherein the source data includes one of audio content and image content.

35. The method according to claim 18, further comprising receiving at a listener device each encoded row and the first predetermined number of rows of column error-correction data of the data block; and requesting a second predetermined number of rows of column error-correction data to be transmitted when a number of errors contained in the transmitted encoded rows and the first predetermined number of rows of column error-correction data exceeds an error correction capability of the transmitted row error-correction data and the predetermined number of rows of column error-correction data, the second predetermined number of rows of column error-correction data being selected from the rows of column error-correction data that were not transmitted with the encoded rows corresponding to the second predetermined number of rows of column error-correction data.

36. A method of communicating source data from a data source over a communications link, the method comprising:

receiving an encoded data block transmitted over the communication link, the encoded data block being formed by organizing a selected portion of source data into a data block having rows and columns;

forming an encoded column from each column of the data block by appending column error-correction data for the column to the column, the column error-correction data being formed for each column by using a Reed-Solomon code to form the column error-correction data;

forming an encoded row from each row of the data block and from each row of column error-correction data by appending row error-correction data for the row to the row, the row error-correction data being formed for each row by using a BCH-type code to form the row error-correction data; and transmitting each encoded row and a first predetermined number of rows of column error-correction data of the data block over the communication link, the first predetermined number of rows being less than a total number of rows formed by column error-correction data; and requesting a second predetermined number of rows of column error-correction data to be transmitted when a number of errors contained in the transmitted encoded rows and the first predetermined number of rows of column error-correction data exceeds an error correction capability of the transmitted row error-correction data and the predetermined number of rows of column error-correction data, the second predetermined number of rows of column error-correction data being selected from the rows of column error-correction data that were not transmitted with the encoded rows corresponding to the second predetermined number of rows of column error-correction data.

* * * * *